United States Patent
Murtagh et al.

(10) Patent No.: US 7,079,446 B2
(45) Date of Patent: Jul. 18, 2006

(54) DRAM INTERFACE CIRCUITS HAVING ENHANCED SKEW, SLEW RATE AND IMPEDANCE CONTROL

(75) Inventors: Paul Murtagh, Duluth, GA (US); Roland T. Knaack, Duluth, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 156 days.

(21) Appl. No.: 10/916,901

(22) Filed: Aug. 12, 2004

(65) Prior Publication Data

US 2005/0259504 A1  Nov. 24, 2005

Related U.S. Application Data

(60) Provisional application No. 60/573,254, filed on May 21, 2004.

(51) Int. Cl.
*G11C 8/00* (2006.01)

(52) U.S. Cl. .................. 365/233; 365/191; 711/105; 711/167

(58) Field of Classification Search ............ 365/191 X, 365/193, 194, 198, 230.06, 233 O; 711/105 X, 711/167 X
See application file for complete search history.

(56) References Cited

U.S. PATENT DOCUMENTS

| 6,754,861 | B1 * | 6/2004 | Reichle et al. ............... 714/724 |
| 6,977,539 | B1 * | 12/2005 | McDonagh et al. ......... 327/295 |
| 2002/0067645 | A1 * | 6/2002 | Ohmori et al. ............. 365/200 |
| 2003/0117864 | A1 | 6/2003 | Hampel et al. |
| 2003/0122696 | A1 | 7/2003 | Johnson et al. |
| 2004/0105292 | A1 | 6/2004 | Matsui |
| 2004/0236877 | A1 | 11/2004 | Burton |

FOREIGN PATENT DOCUMENTS

| EP | 1 521 179 A | 4/2005 |
| JP | 2004 139552 A | 5/2004 |

OTHER PUBLICATIONS

Demerjian, Charlie, "Intel FB-DIMMs to offer real memory breakthroughs, Part One Fully buffered DIMMs take shape," http://www.theinquirer.net/print.aspx?article=15167 &print=1, Printed Apr. 5, 2005, 2 pages.

Demerjian, Charlie, "There's magic in the Intel FB-DIMM old buffer, Part Two Memory technologies," http://www.theinquirer.net/print.aspx?article=15189&print=1, Printed Apr. 5, 2005, 4 pages.

(Continued)

*Primary Examiner*—VanThu Nguyen
(74) *Attorney, Agent, or Firm*—Myers Bigel Sibley & Sajovec PA (57) ABSTRACT

Fully-buffered dual in-line memory modules (FB-DIMM) include advanced memory buffers (AMBs) having enhanced skew, slew rate and output impedance control. The AMB includes user accessible registers that can be programmed to carefully control the edge placement (or phase) of signals generated from the AMB to multiple DRAMs on the module. This control of edge placement, which may be performed independently for each group of signals: clock (CLK, CLK#), command (RAS, CAS, WE), address (including bank address), data (DQ) and data strobe (DQS), provides 360 degrees of control (or one period). This means that any group of signals can be moved independently by one complete period relatively to any other group.

21 Claims, 4 Drawing Sheets

OTHER PUBLICATIONS

Demerjian, Charlie, "The beauty of Intel'FB-DIMM architecture, Part Three Conclusion," http://www.theinquirer.net/print.aspx?article=15214&print=1, Printed Apr. 5, 2005, 4 pages.

"Advanced Memory Buffer," NEC Electronics America, Inc., http://www.necelam.com/interface/index.php?Subject=AMB, Printed Apr. 4, 2005, 2 pages.

"Moore, Moore, Moore—New Advanced Memory Buffer," ee Product Center, http://www.eeproductcenter.com/printableArticle.jhtml;jsessionid=CZQ4WRFBFNHLAQS..., Printed Apr. 4, 2005, 3 pages.

"NEC Electronics Showcases Advanced Memory Buffer Technology as a Key Enabling Technology for Increased Bandwidths and Large Memory Capacities at IDF Spring 2005", Press Release: Mar. 1, 2005, http://www.necel.com/en/news/archive/0503/0102.html, Printed Apr. 5, 2005, 2 pages.

"What's an AMB (Advanced Memory Buffer)?," NEC Electronics, http://www.necel.com/cgi-bin/print/print.cgi?h=/en.techhighlights/amb/market_needs.html, Printed Apr. 4, 2005, 2 pages.

International Search Report and Written Opinion of the International Searching Authority for International application No. PCT/US2005/013492 mailed on Jul. 25, 2005.

\* cited by examiner

DRAM INTERFACE CIRCUITS HAVING ENHANCED SKEW, SLEW RATE AND IMPEDANCE CONTROL

REFERENCE TO PRIORITY APPLICATION

This application derives priority from U.S. Provisional Application Ser. No. 60/573,254, filed May 21, 2004, the disclosure of which is hereby incorporated herein by reference.

CROSS-REFERENCE TO RELATED APPLICATIONS

This application discloses subject matter that is related to subject matter disclosed in U.S. application Ser. No. 10/643,208, filed Aug. 18, 2003, Ser. No. 10/648,090, filed Aug. 26, 2003 and Ser. No. 10/616,272, filed Jul. 9, 2003, the disclosures of which are hereby incorporated herein by reference.

FIELD OF THE INVENTION

The present invention relates to integrated circuit devices and methods of operating same and, more particularly, to memory devices and methods of operating memory devices.

BACKGROUND OF THE INVENTION

A fully-buffered dual in-line memory module (FB-DIMM) may utilize an advanced memory buffer (AMB), which is typically disposed on one side of the module. An AMB may have three ports of communication. These ports include high speed serial lanes, which communicate to and from a host mother board chipset via an edge connector and possibly other FB-DIMMs, and an SMBus that provides slow speed two wire serial access for writing and reading configuration and status registers. A high speed parallel interface is also provided that supports bidirectional communication with all DRAMs on the DIMM. This FB-DIMM architecture represents the next generation of DIMMs that can increase the density and bandwidth of a single DIMM and support greater mother board expansion to include more DIMMs.

During normal modes of operation, an FB-DIMM provides no direct access from the edge connector to the DRAMs on the module. Instead, the AMB is responsible for communicating with the edge connector and generating and receiving all signals to and from the DRAMs. The AMB is also responsible for generating the correct timing of signals to and from the DRAMs. Typical AMBs are designed as generic devices that may operate at a data rate from 3.2 Gb/s to 4.8 Gb/s and support as few as nine and as many as 36 DRAMs of different type, while also supporting x4 and x8 data width modes. In order to support this wide range in operating conditions, an AMB includes internal registers that are programmable with configuration data. These internal registers may be accessible by either the SMBus or in-band commands on the high speed serial lanes.

As will be understood by those skilled in the art, an AMB may experience reduced timing margins when the FB-DIMM is running at its maximum speed (e.g., the 4.8 Gb/s rate translates to a 400 MHz DRAM clock or an 800 Mb/s DDR data interface). At this maximum speed, the clock period is nominally 2.5 ns, and the half period or data eye maximum is 1.25 ns. Generating signals that meet these reduced timing margins is difficult because of the presence of timing skew between data, address, command, strobe and clock signals generated to and from the DRAMs. This timing skew is at least partially caused by the physical line length differences between the AMB and the closest and farthest DRAMs on both sides of the DIMM. Accordingly, notwithstanding the advantages of using FB-DIMMs having AMBs to communicate with mother board chipsets, there continues to be a need for more advanced AMBs having better timing skew control.

SUMMARY OF THE INVENTION

Embodiments of the present invention include a fully-buffered dual in-line memory module (FB-DIMM) with an advanced memory buffer (AMB) having enhanced skew, slew rate and output impedance control. The AMB includes user accessible registers that can be programmed to carefully control the edge placement (or phase) of signals generated from the AMB to multiple DRAMs on the module. This control of edge placement, which may be performed independently for each group of signals: clock (CLK, CLK#), command (RAS, CAS, WE), address (including bank address), data (DQ) and data strobe (DQS), provides 360 degrees of control (or one period). This means that any group of signals can be moved independently by one complete period relatively to any other group. In some embodiments, the skew resolution is 6.5 ps in 384 steps, comprising one full period when the AMB is operating at the 4.8 Gb/s rate.

The AMB includes a DRAM interface circuit having clock, address, command, data and strobe driver circuits therein that support independent skew control in response to respective clock, address, command, data and strobe skew control signals. These driver circuits may be responsive to a plurality of timing signals that represent multiple phases of an interface clock signal. The plurality of timing signals may include three timing signals that are phase-offset by 60° relative to each other and provided as inputs to a phase interpolator associated with each driver circuit. Each driver circuit may also include an output buffer responsive to slew rate and impedance control signals. These additional control signals supplement the edge placement control provided by the phase interpolators.

The AMB may also include a dual data rate (DDR) DRAM interface circuit having a plurality of driver circuits therein that provide accurate skew, slew rate and output impedance control. These driver circuits include a clock driver circuit configured to generate an off-chip clock signal in response to an internal clock signal, a multi-bit clock skew control signal (clk_ctl) and a plurality of timing signals that represent multiple phases of an interface clock signal (e.g., three phases of a 400 MHz clock signal). An address driver circuit, a command driver circuit, a data driver circuit and a strobe driver circuit are also provided. The address driver circuit is configured to generate an off-chip address signal in response to an internal address signal, a multi-bit address skew control signal (addr_ctl) and the plurality of timing signals. One command driver circuit is configured to generate an off-chip command signal in response to an internal command signal, a multi-bit command skew control signal (rascaswe_ctl) and the plurality of timing signals. The data driver circuit is configured to generate a plurality of off-chip data signals in response to a plurality of internal data signals, a multi-bit data skew control signal (dout_ctl) and the plurality of timing signals. The strobe driver circuit is configured to generate an off-chip strobe signal in response to an internal strobe signal, a multi-bit strobe skew control signal (dqs_ctl) and the plurality of timing signals. Each of these driver circuits may also include a respective output buffer that is responsive to respective slew rate and impedance control signals. These signals enhance independent edge placement control by reducing the likelihood of overshoot or undershoot of the output signals and eye closure. These output buffers may include a pre-driver stage responsive to the slew rate control signal and an output driver stage responsive to the output impedance control signal.

The groups of signals that are independently controlled include the DRAM clock signals CLK/CLK# [3:0], which are separately controllable relative to each other and the other signals. Two of these clock signals (e.g., CLK/CLK# [2,0]) are for the front side of the DIMM and the other two (e.g., CLK/CLK# [3,1]) are for the back side of the DIMM. The first command signals RAS#A, CAS#A and WE#A are controllable as a group for the front side of the DIMM and the second command signals RAS#B, CAS#B and WE#B are controllable as a group for the back side of the DIMM. Similarly, the command signals CS[1:0]#A and CKE[1:0]A are controllable as a group for the front side of the DIMM and the command signals CS[1:0]#B and CKE[1:0]B are controllable as a group for the back side of the DIMM. The first address and bank address signals (e.g., A[15:0]A, BA[2:0]A) are controllable as a group for the front side of the DIMM and the second address and bank address signals (e.g., A[15:0]B, BA[2:0]B) are controllable as a group for the back side of the DIMM. The data strobe signals DQS/DQS#[17:0], which are routed to respective DRAMs, are independently controllable and the data signals DQ[63:0] are independently controllable in groups of four bits (i.e., eighteen groups of DQ[3:0]). Offset control signals (offset_ctl) may also be used to carefully control the capture of data signals and strobe signals received by the DRAM interface circuit. Other groupings are also possible based on specific application.

DESCRIPTION OF PREFERRED EMBODIMENTS

The present invention will now be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix "#" (or prefix symbol "/") to a signal name may also denote a complementary data or information signal or an active low control signal, for example.

Figure 1:
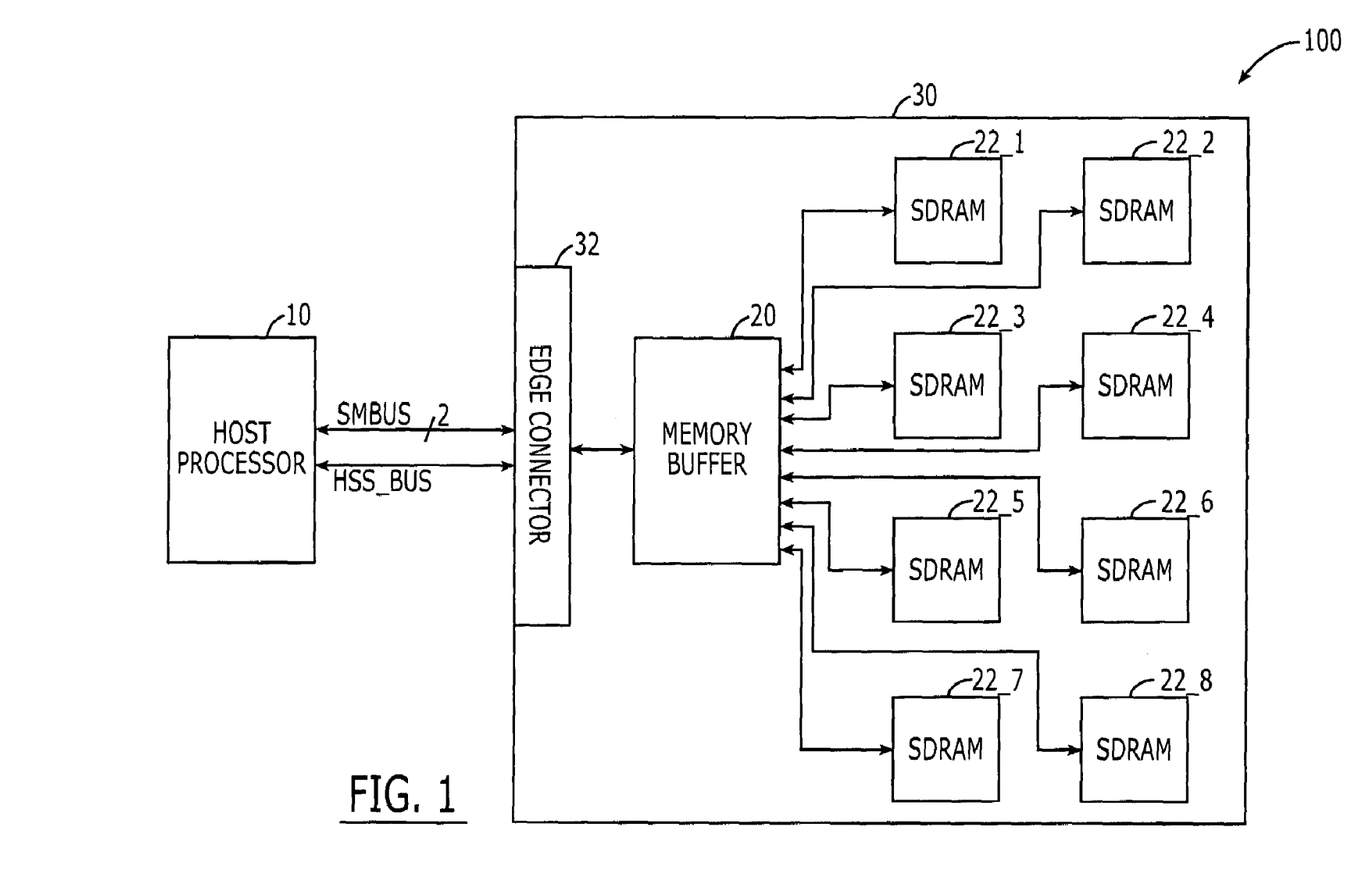
FIG. 1 is a block diagram of an integrated circuit system having a dual in-line memory module (DIMM) therein, according to embodiments of the present invention.

Referring now to FIG. 1, an integrated circuit system 100 is illustrated as including a dual in-line memory module (DIMM) 30 that communicates with a host processor 10 via a high speed serial bus (HSS_BUS) and an SMBus that provides two-wire serial access for writing and reading configuration and status registers within a memory buffer 20 on the DIMM 30. As described more fully herein, the memory buffer 20 and a plurality of DRAMs 22_1 to 22_8 are disposed on the DIMM 30. The DRAMs 22_1 to 22_8 are coupled to the memory buffer 20 by a high speed parallel interface. These DRAMs 22_1 to 22_8 are illustrated as being disposed on one side of a printed circuit board having an edge connector 32 that may be configured to be received within a dual in-line connector mounted on a mother board (not shown). Additional DRAMs may also be provided on the DIMM 30.

Figure 2A:
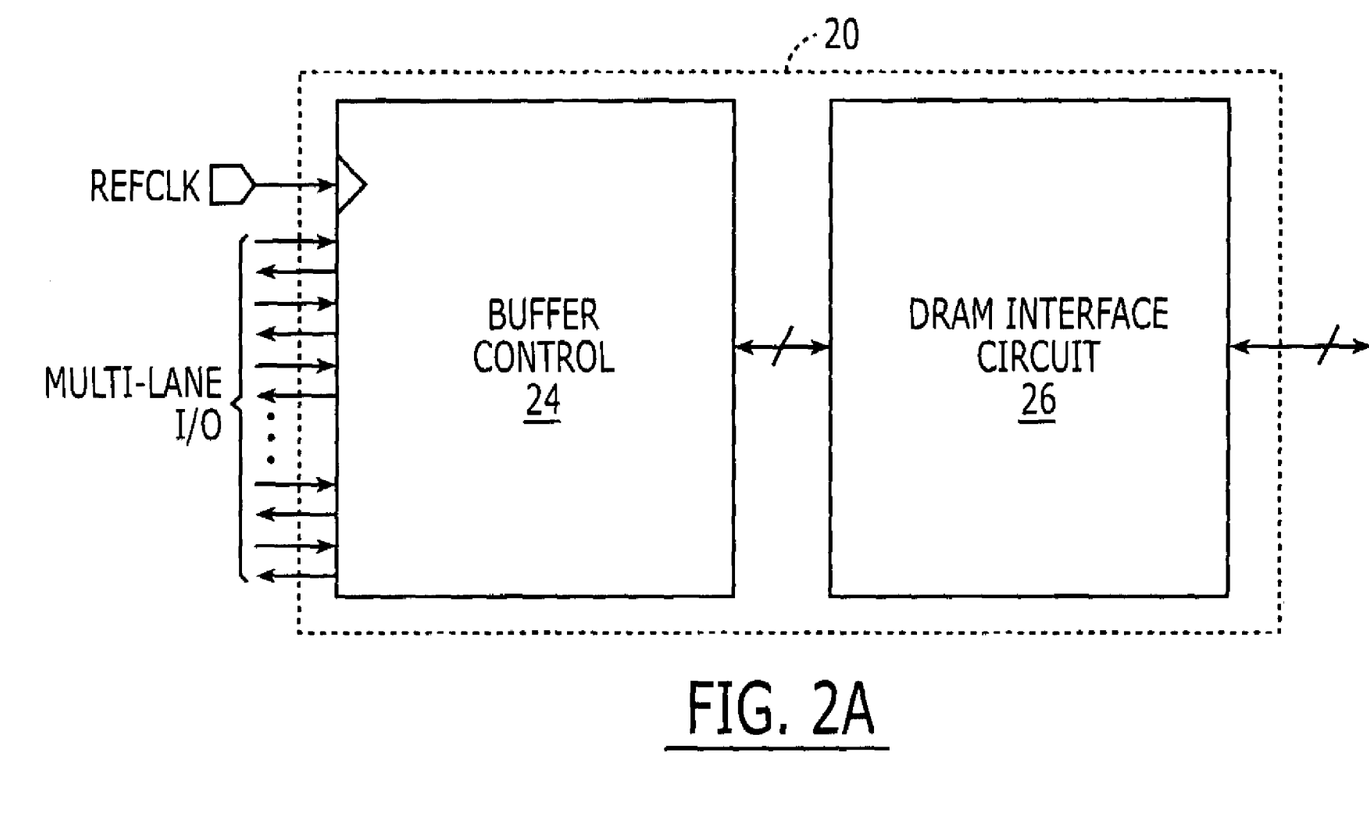
FIG. 2A is a block diagram of a memory buffer according to embodiments of the present invention.

As illustrated by FIG. 2A, the memory buffer 20 includes a buffer control circuit 24 and a DRAM interface circuit 26. The buffer control circuit 24 includes a multi-lane I/O interface, which supports coupling to the high speed serial bus (HSS_BUS). As illustrated by the aforementioned '254 priority application, this multi-lane I/O interface includes fully-buffered I/O drivers and phase-locked loop (PLL) integrated circuits that are configured to receive a reference clock signal (REFCLK). The buffer control circuit 24 also includes user accessible configuration and status registers (not shown). An exemplary DRAM interface circuit 26, which receives control signals from the configuration and status registers, is more fully illustrated by FIG. 2B. This DRAM interface circuit 26 includes a plurality of driver circuits that service a front side of the DIMM 30 and a plurality of driver circuits that service a back side of the DIMM 30. With respect to the front side (side A) of the DIMM 30, the driver circuits include a first clock driver circuit 28-1, a first address driver circuit 28-2, first command driver circuits 28-3 and 28-4 and a front on-die termination (ODTA) driver circuit 28-5. With respect to the back side (side B) of the DIMM 30, the driver circuits include a second clock driver circuit 28-6, a second address driver circuit 28-7, second command driver circuits 28-8 and 28-9 and a back on-die termination (ODTB) driver circuit 28-10. A x18 data and strobe driver circuit 28-11 is also provided, which is responsive to eighteen independent data skew control signals dout_ctl1[17:0] and eighteen independent strobe skew control signals dqs_ctl [17:0]. The skew control signals described herein may be multi-bit skew control signals stored within the user accessible configuration registers. These multi-bit skew control signals may support a skew resolution of 6.5 ps in 384 steps, which covers one full period of an interface clock signal operating at 400 MHz.

Figure 2B:
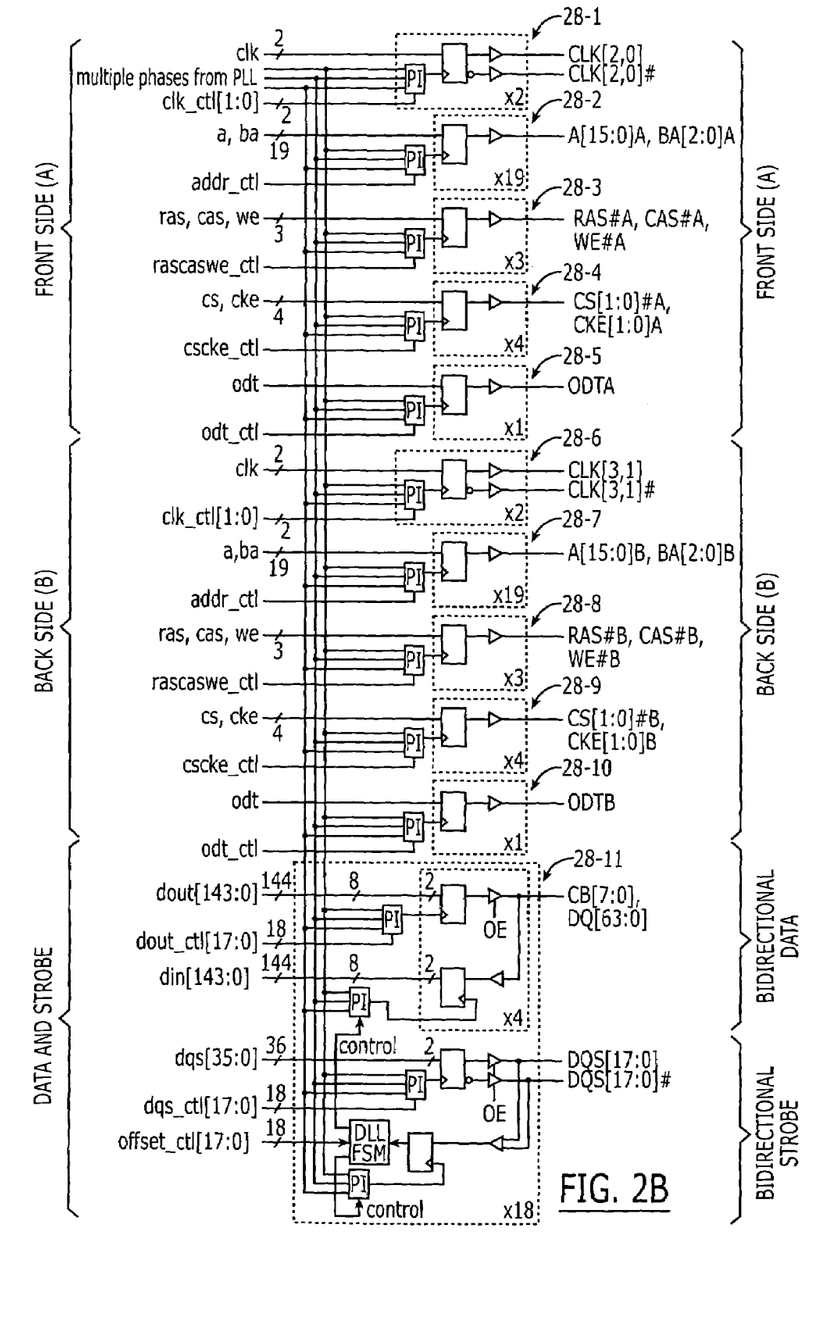
FIG. 2B is an electrical schematic of the DRAM interface circuit of FIG. 2A.
Figure 2C:
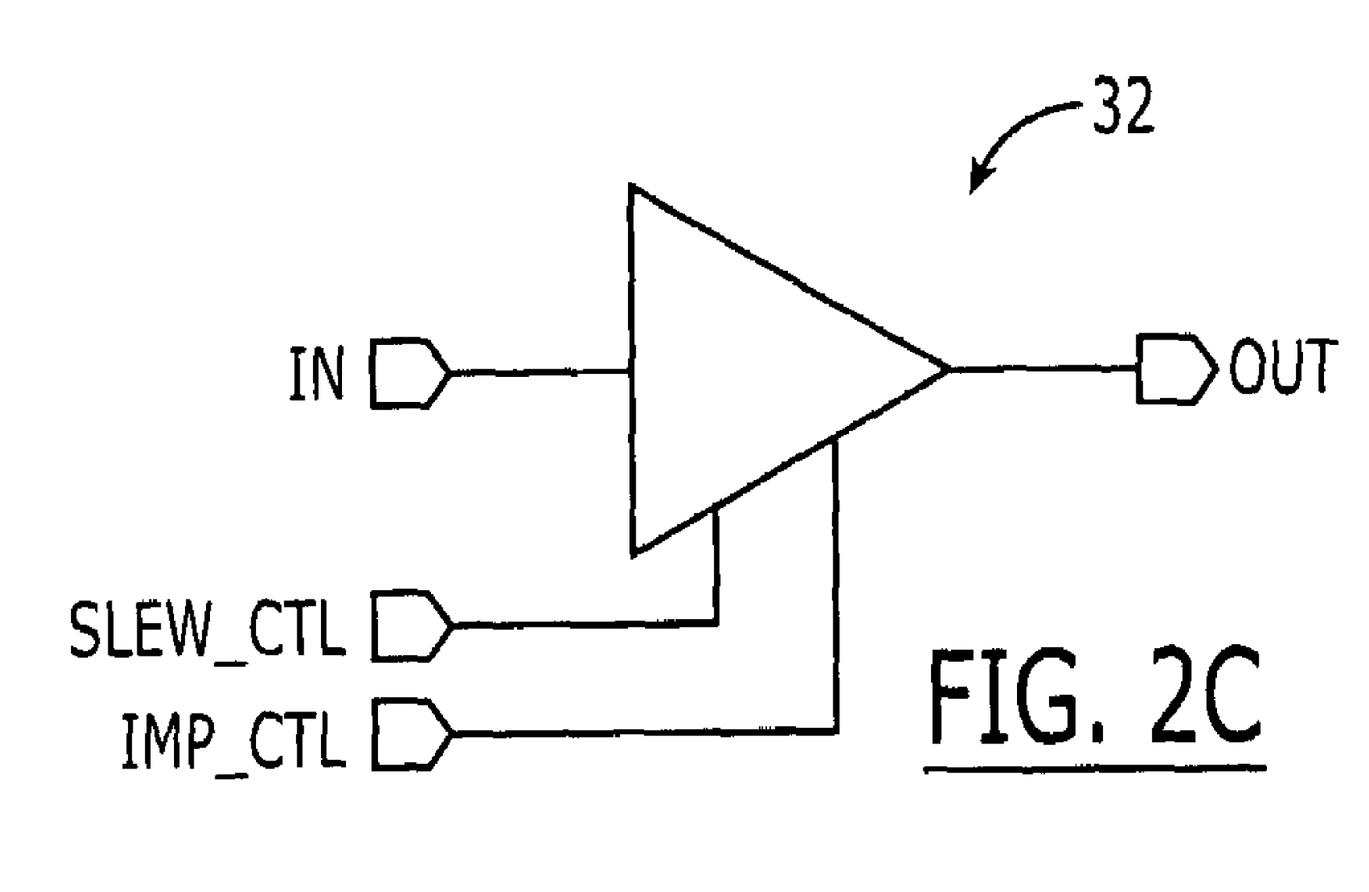
FIG. 2C is an electrical schematic of an output buffer/driver having slew rate and impedance control.

The first clock driver circuit 28-1 is a x2 circuit (i.e., includes two copies of the elements illustrated within the dotted box), with each circuit including a phase interpolator (PI), a flip-flop having complementary outputs and a pair of output buffers/drivers that generate a corresponding pair of true and complementary clock signals CLK and CLK#. FIG. 2C illustrates an exemplary output buffer/driver 32 that can be used in the first clock driver circuit 28-1. This output buffer/driver 32 may include a pre-driver stage and an output driver stage connected in series, with the pre-driver stage being responsive to the slew rate control signal (slew_ctl) and the output driver stage being responsive to the output impedance control signal (imp_ctl). In particular, the pre-driver stage may be configured so that the slew rate of its output can be set in response to the slew rate control signal (slew_ctl) and the pull-up and pull-down impedances of the output driver stage can be set in response to the output impedance control signal (imp_ctl). These control signals (slew_ctl and imp_ctl) provide the same degree of independent control as the various skew control signals described herein. The output buffer/driver 32 may be of conventional design and need not be described further herein.

Each phase interpolator (PI) in the first clock driver circuit 28-1 is configured to receive a plurality of timing signals. As illustrated, these timing signals include three phases of an interface clock signal (e.g., 400 MHz clock signal) generated by a phase-locked loop (PLL) integrated circuit (not shown). The three phases are separated by 600 relative to each other. From these three phases, each phase interpolator may generate three additional phases by inverting each of the illustrated timing signals. In this manner, a total of six phases may be generated that are separated by 60°. In alternative embodiments, all six phases may be generated by the PLL integrated circuit and provided as timing signals to the illustrated phase interpolators (PI).

Each phase interpolator is also responsive to a respective multi-bit clock skew control signal (clk_ctl), which controls the phase of the periodic signal at the output of the phase interpolator. This output is provided as a clock signal to a corresponding flip-flop. In this manner, the values of the clock skew control signals (clk_ctl) operates to set the phases of the complementary outputs of the flip-flops and the phases of the true and complementary clock signals (CLK[0], CLK[0]#) and (CLK[2], CLK[2]#). The phase interpolator may be of conventional design and need not be described further herein.

The first address driver circuit 28-2 is a x19 circuit (i.e., includes nineteen copies of the elements illustrated within the dotted box), with each circuit including a flip-flop having a true output and an output buffer/driver that generates a corresponding bit of an address signal (column and row address (A) and bank address (BA)). The output buffer/driver may be as illustrated by FIG. 2C and described hereinabove. Unlike the first clock driver circuit 28-1, only one phase interpolator (PI) is used in the first address driver circuit 28-2. Thus, the fanout at the output of the phase interpolator is nineteen. The phase interpolator, which is responsive to the plurality of timing signals and the address skew control signal (addr_ctl), sets the skew associated with all nineteen bits of the address signals (A[15:0]A, BA[2:0]A).

The command driver circuit 28-3 is a x3 circuit (i.e., includes three copies of the elements illustrated within the dotted box), with each circuit including a flip-flop having a true output and an output buffer/driver that generates a corresponding command. The three flip-flops are configured to receive a front side row address strobe input signal (ras), a front side column address strobe input signal (cas) and a front side write enable input signal (we), respectively. The generated commands include an active low row address strobe signal RAS#A, an active low column address strobe signal CAS#A and an active low write enable signal WE#A, which are provided to the front side of the DIMM 30. The phase interpolator, which is responsive to the plurality of timing signals and a command skew control signal (rascaswe_ctl), sets the skew associated with all three commands (RAS#A, CAS#A and WE#A). In alternative embodiments, the skews of each of these commands may be independently set.

The command driver circuit 28-4 is a x4 circuit (i.e., includes four copies of the elements illustrated within the dotted box), with each circuit including a flip-flop having a true output and an output buffer/driver that generates a corresponding command. The four flip-flops are configured to receive a pair of chip select signals and a pair of clock enable signals (cs and cke, which correspond to cs[1:0]#A and cke[1:0]A). The phase interpolator, which is responsive to the plurality of timing signals and a command skew control signal (cscke_ctl), sets the skew associated with all four commands (CS[1:0]#A and CKE[1:0]A). In alternative embodiments, the skews of CS[0]#A and CKE[0]A may be set independently of CS[1]#A and CKE[1]A.

The front on-die termination (ODTA) driver circuit 28-5 includes a flip-flop having a true output and an output buffer/driver that generates a corresponding on-die termination signal (ODTA) for the front side of the DIMM 30. The flip-flop is configured to receive an on-die termination signal (odt) for the front side. The phase interpolator, which is responsive to the plurality of timing signals and an ODT skew control signal (odt_ctl), sets the skew associated the front on-die termination signal (ODTA).

The second clock driver circuit 28-6 is a x2 circuit (i.e., includes two copies of the elements illustrated within the dotted box), with each circuit including a phase interpolator (PI), a flip-flop having complementary outputs and a pair of output buffers/drivers that generate a corresponding pair of true and complementary clock signals CLK and CLK#. FIG. 2C illustrates an exemplary output buffer/driver circuit 32 that can be used in the second clock driver circuit 28-6. Each phase interpolator (PI) in the second clock driver circuit 28-6 is configured to receive the plurality of timing signals. Each phase interpolator is also responsive to a respective multi-bit clock skew control signal (clk_ctl) for the back side of the DIMM 30. The values of the two clock skew control signals (clk_ctl) for the back side operate to set the phases of the complementary outputs of the flip-flops and the phases of the true and complementary clock signals (CLK[1], CLK[1]#) and (CLK[3], CLK[3]#).

The second address driver circuit 28-7 is a x19 circuit (i.e., includes nineteen copies of the elements illustrated within the dotted box), with each circuit including a flip-flop having a true output and an output buffer/driver that generates a corresponding bit of an address signal (column and row address (A) and bank address (BA)) for the back side. The output buffer/driver may be as illustrated by FIG. 2C and described hereinabove. Unlike the first clock driver circuit 28-1, only one phase interpolator (PI) is used in the second address driver circuit 28-7. Thus, the fanout at the output of the phase interpolator is nineteen. The phase interpolator, which is responsive to the plurality of timing signals and the address skew control signal (addr_ctl) for the back side, sets the skew associated with all nineteen bits of the address signals (A[15:0]B, BA[2:0]B).

The command driver circuit 28-8 is a x3 circuit (i.e., includes three copies of the elements illustrated within the dotted box), with each circuit including a flip-flop having a true output and an output buffer/driver that generates a corresponding command. The three flip-flops are configured to receive a back side row address strobe input signal (ras), a back side column address strobe input signal (cas) and a back side write enable input signal (we), respectively. The generated commands include an active low row address strobe signal RAS#B, an active low column address strobe signal CAS#B and an active low write enable signal WE#B for the back side of the DIMM 30. The phase interpolator, which is responsive to the timing signals and a command skew control signal (rascaswe_ctl) for the back side, sets the skew associated with all three commands (RAS#B, CAS#B and WE#B).

The command driver circuit 28-9 is a x4 circuit (i.e., includes four copies of the elements illustrated within the dotted box), with each circuit including a flip-flop having a true output and an output buffer/driver that generates a corresponding command. The four flip-flops are configured to receive a pair of chip select signals and a pair of clock enable signals for the back side (cs and cke, which correspond to cs[1:0]#B and cke[1:0]B). The phase interpolator, which is responsive to the timing signals and a command skew control signal (cscke_ctl) for the back side, sets the skew associated with all four commands (CS[1:0]#B and CKE[1:0]B).

The back on-die termination (ODTB) driver circuit 28-10 includes a flip-flop having a true output and an output buffer/driver that generates a corresponding on-die termination signal (ODTB) for the back side of the DIMM 30. The flip-flop is configured to receive an on-die termination signal (odt) for the back side. The phase interpolator, which is responsive to the timing signals and an ODT skew control signal (odt_ctl) for the back side, sets the skew associated the back on-die termination signal (ODTB).

The data and strobe DDR driver circuit 28-11 is a x18 circuit that is configured to receive 144 bits of output data dout[143:0] on 72 data lines operating at dual data rates and generate data and check bits CB[7:0] and DQ[63:0] on eighteen groups of four data output lines. Each of the eighteen DDR driver circuits contains a respective x4 bidirectional data driver circuit therein that is responsive to both rising and falling edges of a synchronizing signal generated by a respective phase interpolator (PI), which is responsive to a respective data out skew control signal (dout_ctl). The eighteen data out skew control signals dout_ctl[17:0] support independent skew control for eighteen groups of four output data lines. As illustrated, the x4 bidirectional data driver circuit includes flip-flops and an output buffer in the output path and an input buffer and flip-flops in the input path. The output buffer is responsive to an output enable signal (OE), which supports a high impedance output state. This output buffer also supports slew rate and output impedance control as illustrated by FIG. 2C.

The data and strobe DDR driver circuit 28-11 is also configured to generate 18 pairs of data strobe signals (DQS[17:0] and DQS[17:0]#) when the DRAM interface circuit 26 is writing data to the DRAMs 22_1 to 22_7 and receive data strobe signals when reading and capturing data read from the DRAMs 22_1 to 22_7. The data strobe signal lines are driven by eighteen pairs of output buffers that are responsive to an output enable signal (OE). Like the output buffer in the x4 bidirectional data driver circuit, each pair of output buffers supports slew rate and output impedance control as illustrated by FIG. 2C. The timing of each pair of data strobe signal lines (DQS and DQS#) is controlled by a respective phase interpolator (PI). Each of the eighteen phase comparators is responsive to a respective one of the eighteen data strobe skew control signals dqs_ctl[17:0].

The control of timing to the data receiving portion of the x4 bidirectional data driver circuit also supports eighteen independent offsets in the capture of read data (din[143:0]). These offsets are controlled by the eighteen offset control signals offset_ctl[17:0], which are provided to a DLL finite state machine (FSM). This DLL FSM generates outputs that are provided to the eighteen phase interpolators associated with the x4 bidirectional data driver circuits and the eighteen phase interpolators associated with the incoming strobe signals (DQS[17:0], DQS[17:0]#) received from the DRAMs 22_1 to 22_7.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   a DRAM interface circuit having clock, address, command and data driver circuits therein that support independent skew control in response to respective clock, address, command and data skew control signals.

2. The device of claim 1, wherein each of the clock, address, command and data driver circuits is responsive to a plurality of timing signals that represent multiple phases of an interface clock signal.

3. The device of claim 2, wherein each of the clock, address, command and data driver circuits is responsive to three (or six) timing signals that are phase-offset by 120° (or 60°) relative to each other.

4. The device of claim 2, wherein the data driver circuit is a dual data rate (DDR) driver circuit that supports 2N bits/second data rates, where N is a frequency of the interface clock signal.

5. The device of claim 2, wherein each of the clock, address, command and data driver circuits comprises a respective phase interpolator responsive to the plurality of timing signals.

6. The device of claim 2, wherein at least one of the clock, address, command and data driver circuits comprises an output buffer responsive to slew rate and impedance control signals.

7. The device of claim 1, wherein at least one of the clock, address, command and data driver circuits comprises an output buffer responsive to slew rate and impedance control signals.

8. The device of claim 1, wherein each of the clock, address, command and data driver circuits comprises an output buffer responsive to respective slew rate and impedance control signals.

9. An integrated circuit device, comprising:
   a DRAM interface circuit having clock, address, command and data driver circuits therein that support independent skew, slew rate and impedance control in response to respective clock, address, command and data skew, slew rate and impedance control signals.

10. The device of claim 9, wherein each of the clock, address, command and data driver circuits is responsive to a plurality of timing signals that represent multiple phases of an interface clock signal.

11. The device of claim 10, wherein each of the clock, address, command and data driver circuits is responsive to three (or six) timing signals that are phase-offset by 120° (or 60°) relative to each other.

12. The device of claim 10, wherein the data driver circuit is a dual data rate (DDR) driver circuit that supports 2N bits/second data rates, where N is a frequency of the interface clock signal.

13. A DIMM-compatible memory buffer, comprising:
    a dual data rate DRAM interface circuit having clock, address, command, data and strobe driver circuits therein that support independent skew control in response to respective clock, address, command, data and strobe skew control signals.

14. The device of claim 13, wherein each of the clock, address, command and data driver circuits is responsive to a plurality of timing signals that represent multiple phases of an interface clock signal.

15. The device of claim 14, wherein each of the clock, address, command and data driver circuits is responsive to three (or six) timing signals that are phase-offset by 120° (or 60°) relative to each other.

16. A dual data rate DRAM interface circuit, comprising:
a clock driver circuit configured to generate an off-chip clock signal in response to an internal clock signal, a multi-bit clock skew control signal and a plurality of timing signals that represent multiple phases of an interface clock signal;
an address driver circuit configured to generate an off-chip address signal in response to an internal address signal, a multi-bit address skew control signal and the plurality of timing signals;
a command driver circuit configured to generate an off-chip command signal in response to an internal command signal, a multi-bit command skew control signal and the plurality of timing signals; and
a data driver circuit configured to generate a plurality of off-chip data signals in response to a plurality of internal data signals, a multi-bit data skew control signal and the plurality of timing signals.

17. The interface circuit of claim 16, further comprising a strobe driver circuit configured to generate an off-chip strobe signal in response to an internal strobe signal, a multi-bit strobe skew control signal and the plurality of timing signals.

18. The interface circuit of claim 17, wherein the plurality of timing signals represent multiple phases of an interface clock signal.

19. The interface circuit of claim 17, wherein the plurality of timing signals is three (or six) timing signals that are phase-offset by 120° (or 60°) relative to each other.

20. The interface circuit of claim 16, wherein at least one of said address driver circuit, command driver circuit and said data driver circuit comprises an output buffer responsive to slew rate and impedance control signals.

21. An integrated circuit device, comprising:
a DRAM interface circuit having clock and data driver circuits therein that are responsive to a plurality of phases of an interface clock signal, said clock and data driver circuits configured to support independent skew control over a full period of the interface clock signal, in response to respective clock and data skew control signals.

* * * * *